(12) United States Patent
Grebet et al.

(10) Patent No.: US 9,997,554 B2
(45) Date of Patent: Jun. 12, 2018

(54) CHIP SCALE PACKAGE CAMERA MODULE WITH GLASS INTERPOSER HAVING LATERAL CONDUCTIVE TRACES BETWEEN A FIRST AND SECOND GLASS LAYER AND METHOD FOR MAKING THE SAME

(71) Applicant: STMICROELECTRONICS PTE LTD, Singapore (SG)

(72) Inventors: Jean-Michel Grebet, Singapore (SG); Wee Chin Judy Lim, Singapore (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 190 days.

(21) Appl. No.: 14/582,758

(22) Filed: Dec. 24, 2014

(65) Prior Publication Data

US 2016/0190192 A1 Jun. 30, 2016

(51) Int. Cl.
*H01L 27/146* (2006.01)
*H04N 5/225* (2006.01)
*G02B 5/20* (2006.01)

(52) U.S. Cl.
CPC .. *H01L 27/14625* (2013.01); *H01L 27/14618* (2013.01); *H04N 5/2253* (2013.01); *G02B 5/208* (2013.01)

(58) Field of Classification Search
CPC ......... H01L 27/14625; H01L 27/14618; H01L 2924/15311; H01L 2224/48227; H01L 31/0203; H01L 27/14636; H04N 5/2253; H04N 5/2254; H04N 5/2252; G02B 5/208

USPC .......... 250/239, 216, 214 R, 208.1; 257/431, 257/432, 433, 434
See application file for complete search history.

(56) References Cited

U.S. PATENT DOCUMENTS

| 4,830,264 | A  | * | 5/1989  | Bitaillou | H01L 21/4853 228/180.21 |
| 6,413,620 | B1 | * | 7/2002  | Kimura    | H05K 3/20 174/251 |
| 6,472,247 | B1 | * | 10/2002 | Andoh     | H01L 27/14618 257/E21.511 |
| 7,141,869 | B2 | * | 11/2006 | Kim       | H01L 27/14618 257/673 |

(Continued)

FOREIGN PATENT DOCUMENTS

CN 1754254 A 3/2006

*Primary Examiner* — Que T Le
*Assistant Examiner* — Jennifer Bennett
(74) *Attorney, Agent, or Firm* — Seed Intellectual Property Law Group LLP

(57) ABSTRACT

One or more embodiments disclosed herein are directed to a chip scale package camera module that includes a glass interposer between a lens and an image sensor. In some embodiments, the glass interposer is made from one or more layers of optical quality glass and includes an infrared filter coating. The glass interposer also includes electrically conductive paths to connect the image sensor, mounted on one side of the glass interposer, with other components such as capacitors, which may be mounted on a different side of glass interposer, and the rest of the camera system. The conductive layers include traces and vias that are formed in the glass interposer in areas away from the path of light in the camera module, such that the traces and vias do not block the light between the lens and the image sensor.

21 Claims, 7 Drawing Sheets

(56) References Cited

U.S. PATENT DOCUMENTS

| | | | |
|---|---|---|---|
| 2006/0256222 A1* | 11/2006 | Tsai | H01L 27/14618 348/308 |
| 2008/0246868 A1* | 10/2008 | Abe | H04N 5/2257 348/308 |
| 2009/0321119 A1* | 12/2009 | Kohara | H01L 23/49822 174/260 |
| 2010/0289104 A1* | 11/2010 | Ra | H01L 27/14618 257/459 |
| 2011/0141346 A1* | 6/2011 | Ryu | H04N 5/2252 348/374 |
| 2012/0286400 A1 | 11/2012 | Camacho et al. | |
| 2014/0035080 A1* | 2/2014 | Lee | H01L 27/14618 257/432 |
| 2015/0138420 A1* | 5/2015 | Looi | G03B 3/10 348/335 |

\* cited by examiner

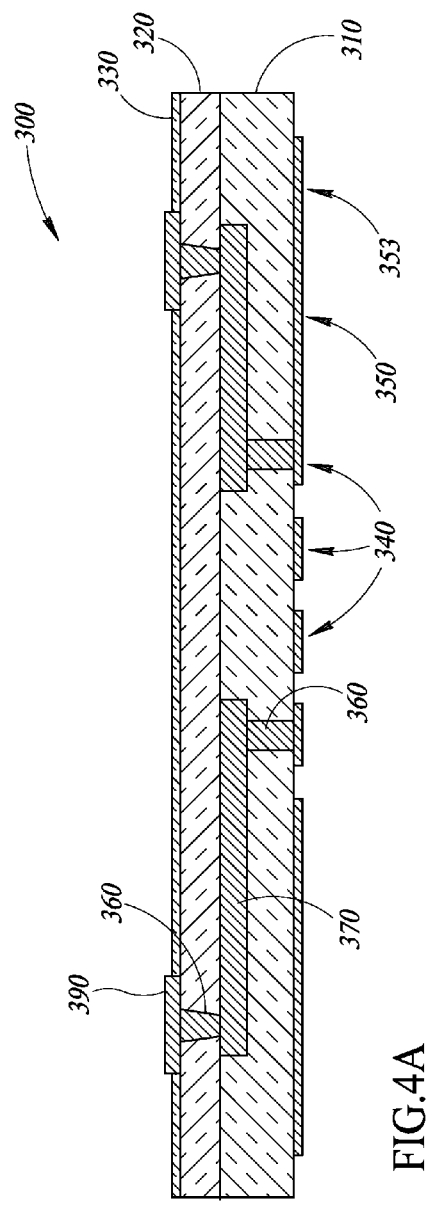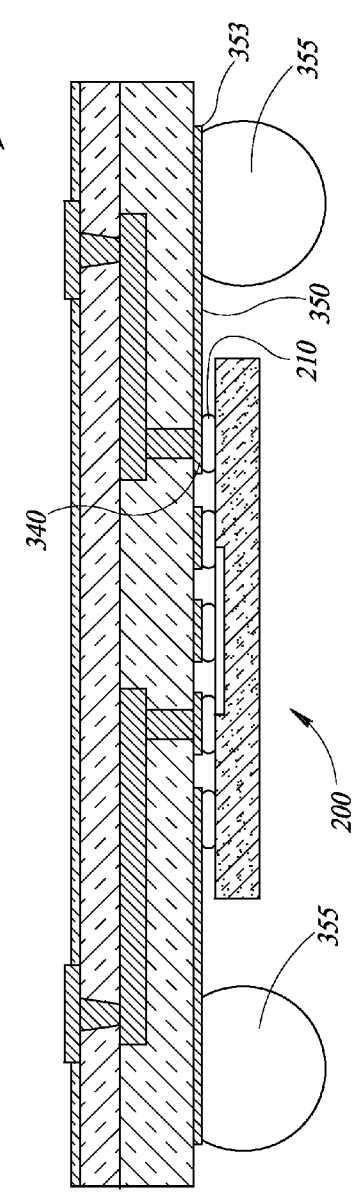
FIG.4A
FIG.4B

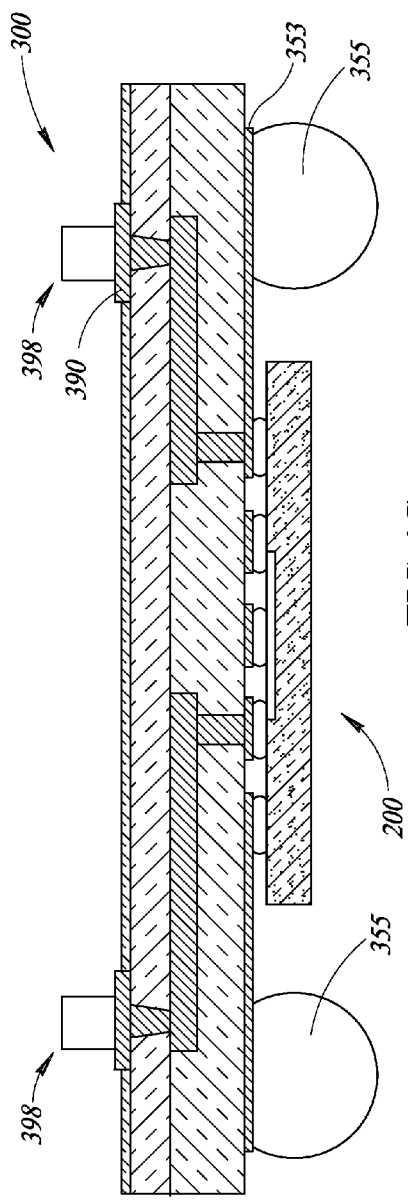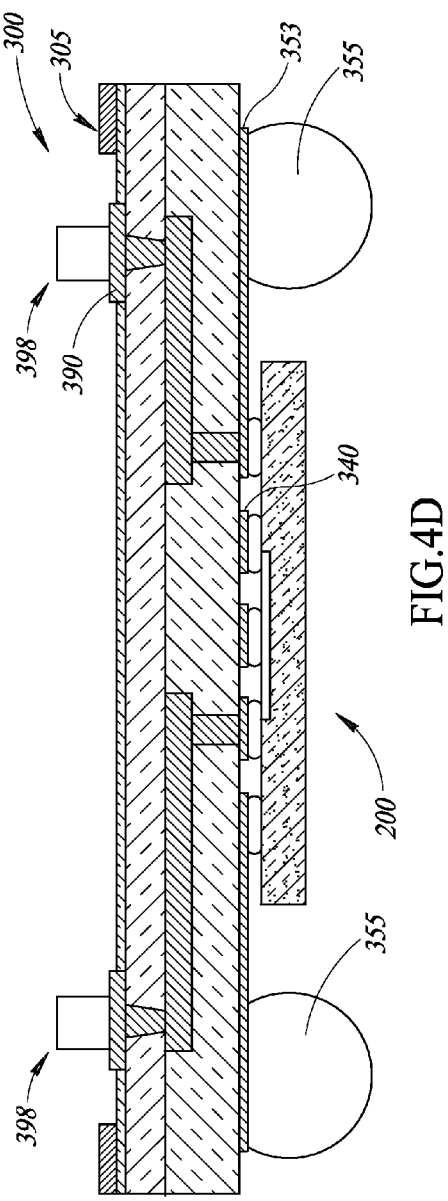

CHIP SCALE PACKAGE CAMERA MODULE WITH GLASS INTERPOSER HAVING LATERAL CONDUCTIVE TRACES BETWEEN A FIRST AND SECOND GLASS LAYER AND METHOD FOR MAKING THE SAME

BACKGROUND

Technical Field

Embodiments are directed to chip scale package camera modules with a glass interposer and methods for making the same.

Description of the Related Art

Camera modules are generally used in small or portable devices, such as smart phones, tablets, web cameras, wearable cameras, and action cameras. A camera module can include a lens for gathering and focusing light, an image sensor, such as a CMOS imager for capturing the light from the lens, a infrared filter that rejects at least a portion of the incoming infrared light and prevents the rejected light from reaching the image sensor, and a circuit board or an organic substrate on which the CMOS imager is mounted. The circuit board connects the imager components, such as capacitors and the image sensor, to the rest of the camera system, which may include memory for storing images, a processor, and other components.

The various components of a camera module are stacked one on top of another, each layer adding its thickness to the overall height of the camera module. Each component also contributes to errors to the alignment of the lens with the imager, and some components, such as the circuit board or organic substrate, can warp and cause further misalignment of the image sensor with the lens.

BRIEF SUMMARY

One or more embodiments disclosed herein are directed to a chip scale package camera module that includes a glass interposer between a lens and an image sensor. In some embodiments, the glass interposer is made from one or more layers of optical glass and includes an infrared filter coating. The glass interposer also includes electrically conductive paths to connect the image sensor, mounted on one side of the glass interposer, with other components such as capacitors, which may be mounted on an opposing side of the glass interposer. The conductive layers includes traces and vias that are formed in the glass interposer in areas away from the path of light in the camera module, such that the traces and vias do not block the light between the lens and the image sensor.

One embodiment is directed to a camera module that has a glass interposer between a lens mount and the image sensor. In some embodiments, the glass interposer includes two or more layers of glass, a top layer and a bottom layer, with conductive traces between the top and bottom layers. The top layer includes through vias that electrically connect a pad at a top surface of the glass interposer with the conductive traces. The bottom layer also includes through vias that electrically connect a pad on a bottom surface of the glass interposer with the conductive traces. In this way, components on the top surface of the glass interposer, such as capacitors, can be connected in electronic communication with components on the bottom surface of the glass interposer.

In one embodiment, an image sensor is coupled to pads on the bottom surface of the glass interposer. The image sensor is coupled to components on the top surface of the glass interposer by vias and traces that are located in or on the glass interposer. The image sensor may also be electrically coupled to a circuit board or the rest of the camera system through solder balls or other electrical connections coupled to the bottom surface of the glass interposer.

In one embodiment, one or more of top and bottom surfaces of the glass interposer include or are coated with an infrared filter. The infrared filter acts to prevent or reduce the amount of infrared light that would otherwise reach the image sensor.

BRIEF DESCRIPTION OF THE SEVERAL VIEWS OF THE DRAWINGS

In the drawings, identical reference numbers identify similar elements or acts. The size and relative positions of elements in the drawings are not necessarily drawn to scale.

FIGS. 4A-4E are schematic cross sections of the chip scale package camera module of FIG. 1 at different stages in a manufacturing process according to one embodiment of the present disclosure.

DETAILED DESCRIPTION

In the following description, certain specific details are set forth in order to provide a thorough understanding of various embodiments of the disclosure. However, one skilled in the art will understand that the disclosure may be practiced without these specific details. In other instances, well-known structures associated with electronic components, camera components, and electronic and camera component fabrication have not been described in detail to avoid unnecessarily obscuring the descriptions of the embodiments of the present disclosure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Figure 1:
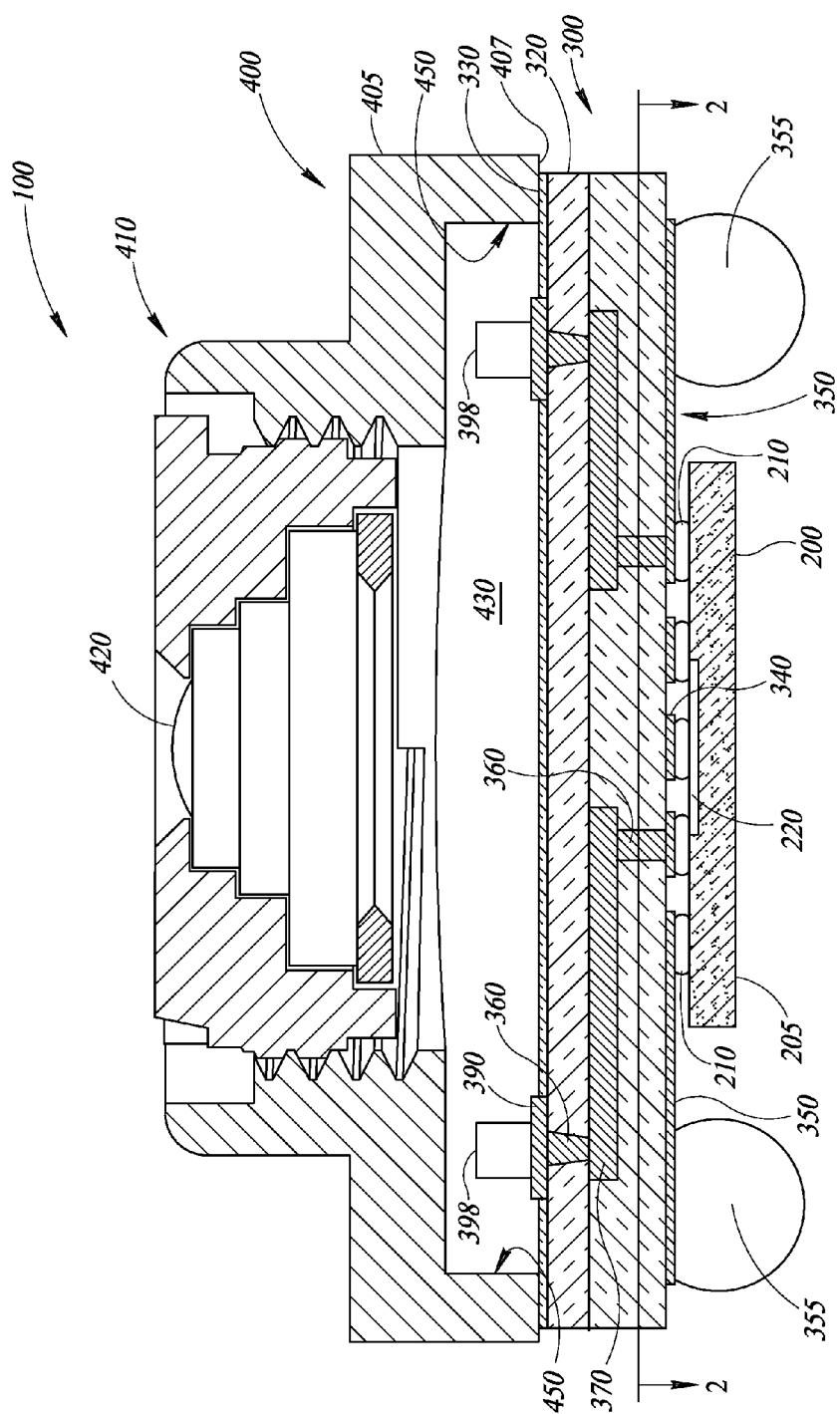
FIG. 1 is a schematic cross section of a chip scale package camera module including a glass interposer and an image sensor according to one embodiment of the present disclosure.
Figure 2:
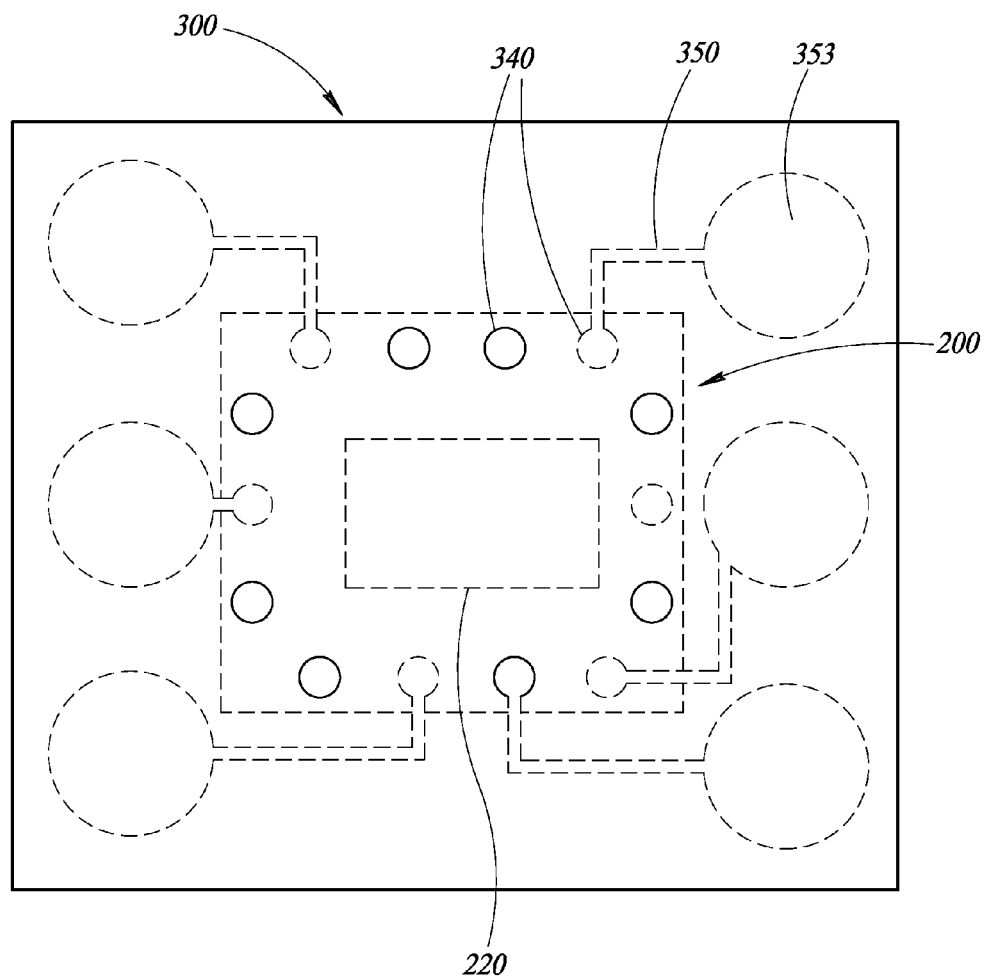
FIG. 2 is a cross-sectional view of the glass interposer shown FIG. 1.
Figure 3A:
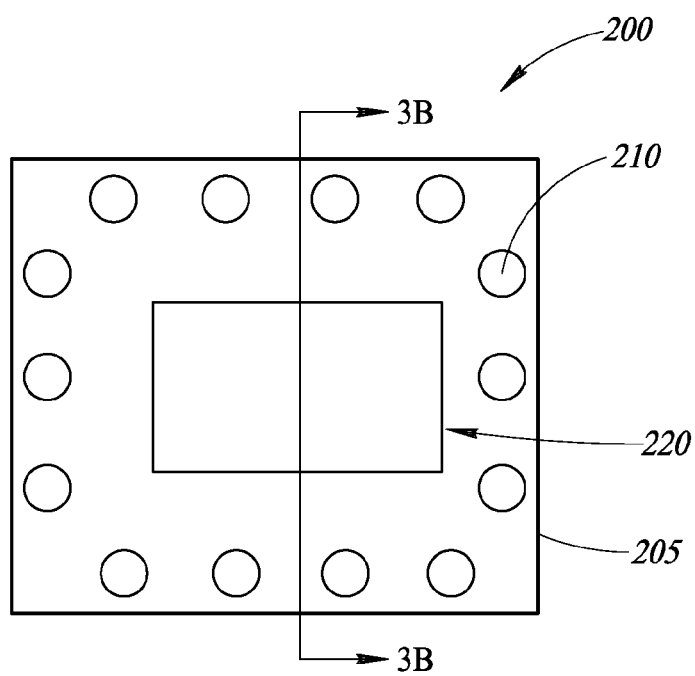
FIG. 3A is a top view of the image sensor of FIG. 1 according to one embodiment of the present disclosure.
Figure 3B:
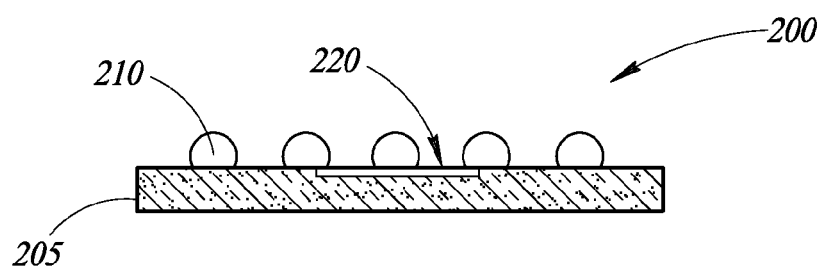
FIG. 3B is a cross-sectional view of the image sensor of FIG. 3A according to one embodiment of the present disclosure.

FIGS. 1, 2, 3A, and 3B show an embodiment of a chip scale package (CSP) camera module. FIG. 1 shows a cross section of an embodiment of an assembled chip scale package camera module 100. FIG. 2 shows a cross section of an embodiment of a glass interposer 300 with an attached sensor die 200 taken along line 2 of FIG. 1. FIG. 3A shows a top view of the sensor die 200 and FIG. 3B shows a cross section of the sensor die 200 taken along line 3B of FIG. 3A. A CSP module, such as the CSP camera module 100, is sized such that it may be directly coupled to a circuit board, similar to how a chip or other integrated circuit component may couple to a circuit board. CSP modules also couple to a circuit board using surface mounting techniques.

The CSP Camera Module 100 includes a lens housing 400 coupled to a first side of a glass interposer 300 and a sensor die 200 coupled to a second, opposite, side of the glass interposer 300.

The lens housing 400 includes a frame 405 and a lens barrel 410 that holds a lens 420 and other devices associated with the operation of the lens 420. For example, the lens housing 400 may include auto focus mechanisms for moving the lens relative to the housing and the image sensor 220 to focus an image projected on the image sensor 220. The lens 420 is mounted to a lens barrel 410. The lens barrel 410 is moveable relative to the frame 405. In some embodiments, the CSP camera module 100 may be of a fixed focus type, wherein a lens barrel 410 and lens 420 are manually adjusted relative to the frame 405 and image sensor 220 during manufacturing.

The lens housing 400 also includes a cavity 430 that may be surrounded by cavity sidewalls 450. The cavity may house electrical components including surface mounted devices, such as capacitors 398 mounted to the surface of the glass interposer 300. The cavity 430 may be suitably sized such that the lens housing 400 provides clearance for or otherwise does not interfere with the components or devices mounted to the surface of the glass interposer 300.

The lens housing 400 and, in particular, the lens frame 405 may include a mounting surface 407. In some embodiments, the mounting surface 407 may be at the bottom of the sidewalls 450. The mounting surface 407 provides a surface for coupling the lens housing 400 with the glass interposer 300.

The glass interposer 300 may include one or more layers of glass 310, 320, vias 360, and conductive traces 370. The conductive traces 370 electrically couple pads 390 on the upper surface of the glass interposer 300 with pads 340 on the lower surface of the glass interposer 300.

The first layer of glass 310 may have through vias 360 chemically etched through the thickness of the glass and filled with an electrical conductor, for example, copper. Conductive traces 370 are located between the first layer of glass 310 and the second layer of glass 320. The conductive traces 370 may include copper or other conductive material. The conductive traces 370 connect the vias 360 in the first layer of glass 310 with the vias 360 in the second layer of glass. Although only a limited number of traces 350, 370 and vias 360 are shown in the figures, it is to be appreciated that any number of conductive traces 350, 370 and vias 360 may be used.

The bottom surface of the first layer of glass 310 may include pads, such as surface mount pads 340, 353, conductive traces 350, and solder balls 355. The conductive traces 350 may include copper, nickel, or gold material. The conductive traces 350 may electrically couple the surface mount pads 340 to the solder ball surface mount pads 353 and the solder balls 355 or other conductive or electrical components. The solder balls 355 electrically couple the CSP camera module 100 and components therein, with components external to the CSP camera module 300, such as a substrate, board, such as a printed circuit board.

The bottom surface of the first layer of glass 310 may also include other electrical components, as described above in reference to the upper surface of the second layer of glass 320. The electrical components may be directly coupled to the surface mount pads 340 or may be electrically coupled to the surface mount pads via conductive traces 350.

The second layer of glass 320 may include conductive vias 360 through the thickness of the glass. The conductive vias may be made from copper or other electrically conductive material. The conductive vias 360 may be electrically coupled to the conductive traces 370.

Figure 5:
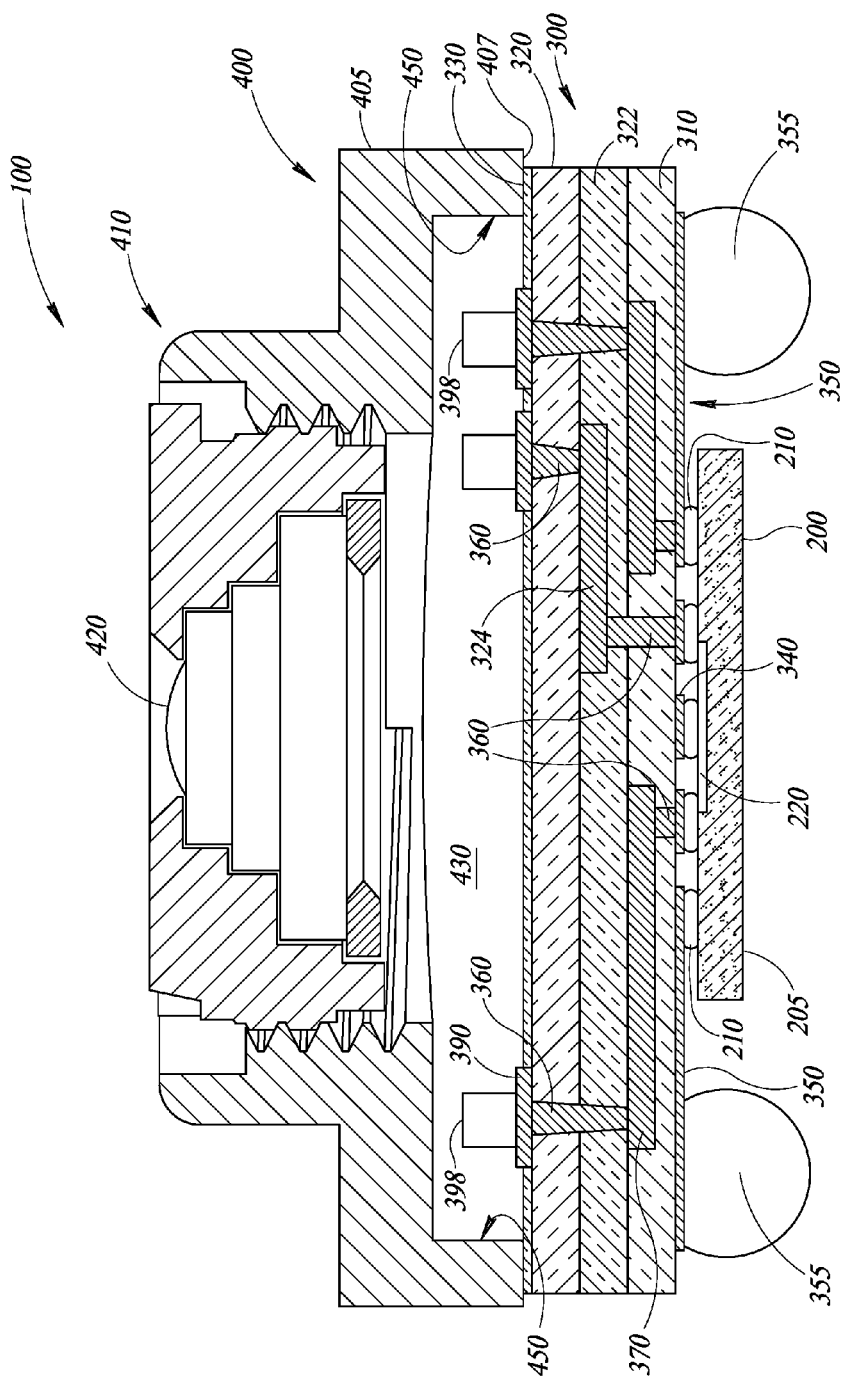
FIG. 5 is a schematic cross section of a chip scale package camera module including a glass interposer and an image sensor according to one embodiment of the present disclosure.

When the glass interposer 300 includes more than two layers of glass, the additional layers of glass 322 may also include through vias 360 and traces 324 there between. In some embodiments, the glass interposer may have three or four layers of glass with two or three layers of conductive traces 370 between the layers of glass, such as the three glass layers 320, 322, and 310 shown in FIG. 5. In some embodiments, the glass interposer 300 may include more than four layers of glass and more than three layers of conductive traces 370.

An upper surface of the second layer of glass 320 may include pads 390 electrically coupled to the through vias 360. The pads 390 may be further coupled to electrical components mounted to the upper surface of the second layer of glass 320, and also to the upper surface of the glass interposer. The pads 390 may be directly coupled to the electrical components, or the pads 390 may be electrically coupled to the electrical components via conductive traces, similar to how the lower surface of the first layer of glass may include conductive traces 350 to couple the pads 340 with the solder balls 355.

One or both of the upper surface of the second layer of glass 320 and the upper surface of the glass interposer 300 may be coated with a light filter coating, such as an infrared filter coating 330. The infrared filter coating 330 filters infrared wavelengths of light, thereby reducing or eliminating the amount of infrared light that passes through the glass interposer 300. Although the glass interposer 300 shown in FIG. 1 includes a single filter coating, the bottom surface of the glass interposer 300 may include an additional filter coating, for example a second infrared filter coating to further reduce the amount of infrared light that can pass through the glass interposer.

The CSP camera module 100 includes a sensor die 200 coupled to the lower surface of the glass interposer 300. The sensor die 200 may be coupled to the lower glass interposer 300 via conductive coupling structures 210, such as solder bumps, stud bumps or copper pillars balls. The conductive coupling structures 210 provide an electrically conductive path between the integrated circuits in the sensor die 200 and the components in the CSP camera module 100, such as conductive vias 360 and conductive traces 370 of the glass interposer 300, the surface mount pads 340, the solder balls 355, and the capacitors 398.

The sensor die 200 includes an image sensor 220 in a semiconductor substrate 205. The image sensor 220 captures light that passes through the lens 420 and the glass interposer 300, and is used as part of the process of creating digital photos and videos.

As shown in FIG. 2, the pads 340 and the conductive traces 350 are placed and routed such that they do not block or pass in front of the image sensor 220, or otherwise interfere with the light passing through the lens 420 and the glass interposer 300. The conductive traces 370 and the other conductors, such as the pads 340, and components, such as the capacitors 398, are also placed and routed in or on the glass interposer such that they do not block or pass in front of the image sensor 220, or otherwise interfere with the light passing through the lens 420 and the glass interposer 300.

The glass interposer 300 performs the functions of filtering the incoming light from the lens 420 and routes electrical connections and provides communication pathways between the sensor die 200 and the electrical components, such as the capacitors 398. The glass interposer may also route electrical connections and provide communication pathways between the CSP camera module 100 and components external thereto, such as to a circuit board, substrate, or other electrical component.

Using the glass interposer 300 between the lens housing 400 and the sensor die 200 reduces the total thickness of the CSP camera module 100. Using the glass interposer 300 also produces a more reliable and accurate camera module. For example, the glass interposer 300 is more thermally stable than previously used materials, such as organic substrates with a glass substrate coated with an IR filter. A more thermally stable glass interposer allows for more reliable long term operation than would be available when a sensor die is mounted to an organic substrate. In addition, organic substrates are more susceptible to warping during the manufacturing process than the glass interposer.

Warping of the organic substrate leads to degradation in the alignment of the image sensor on the sensor die and the lens. The warping can also cause both lateral and angular alignment problems. Lateral alignment is the side to side alignment of the sensor with the lens; the center of the image sensor is ideally aligned with the center of the lens. Angular alignment is the alignment of the surface of the image sensor with the central axis of the lens; the surface of the image sensor should be perpendicular to the central axis of the lens.

Figure 4E:
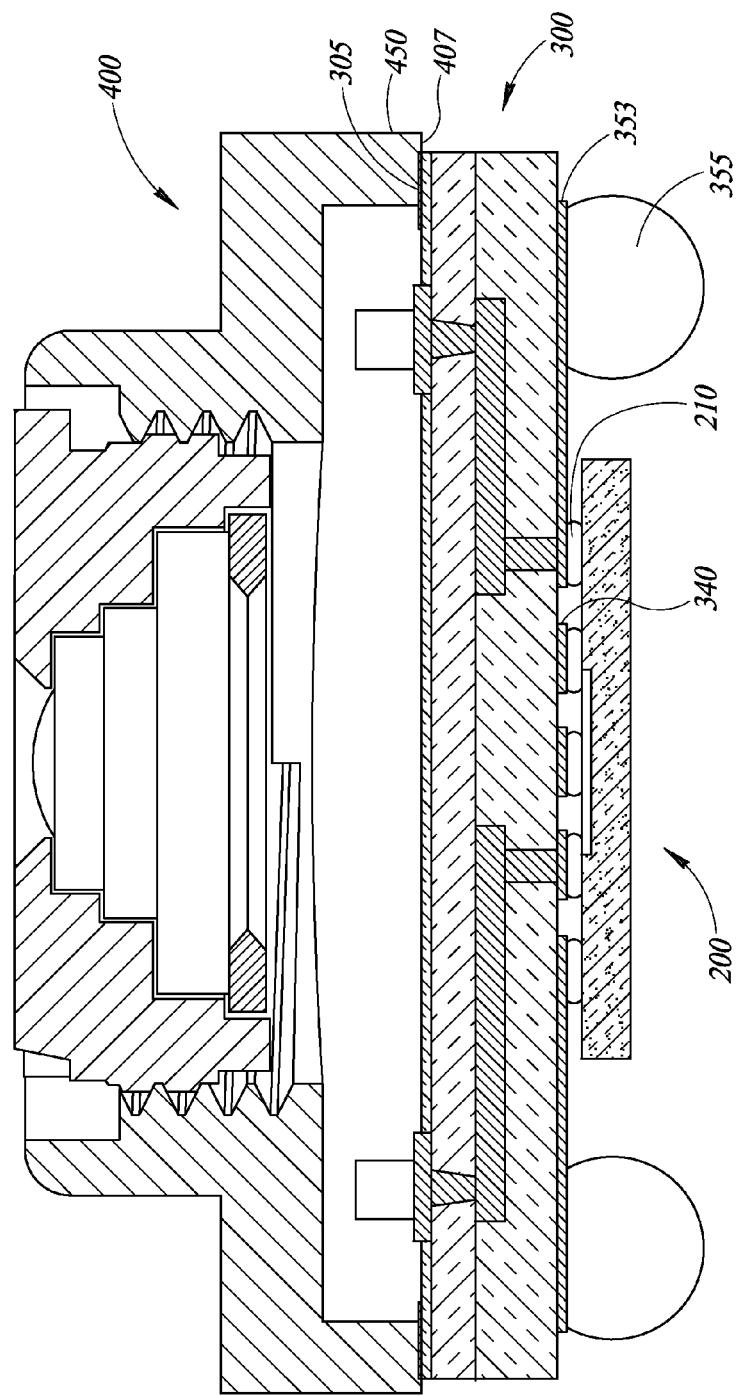

FIGS. 4A through 4E depict an embodiment of a method for making the CSP camera module 100. In FIG. 4A the glass interposer 300 is provided. As described above, the glass interposer 300 may include two or more layers of glass 310, 320. The layers of glass 310, 320 are joined or coupled together. The conductive traces 370 may be formed on one or both of the layers of glass 310, 320. The layers of glass 310, 320 may have vias 360 etched through their thickness such that when the layers of glass 310, 320 are mated or joined to each other, the vias 360 connect pads 390 on a first surface of the glass interposer 300 with pads 340 on a second surface of the glass interposer 300. The pads 340, 390 and the vias 360 may be formed using standard semiconductor techniques including, patterning, wet or dry etching, or other techniques. The infrared filter coating 330 is applied via standard filter coating techniques including, for example a vapor deposition process. The infrared filter coating 330 may be applied to one or more surfaces of the glass interposer.

As shown in FIG. 4B, the solder balls 355 and the sensor die 200 are attached to the bottom of the glass interposer 300 using standard semiconductor assembly techniques. In particular, the sensor die 200 is attached to the glass interposer 300 via conductive coupling structures 210 that electrically couple electrical connections, such as pads, on the sensor die with the pads 340 on the glass interposer 300. The sensor die 200 may be a bumped sensor die in which the conductive coupling structures 210 are soldered to the sensor die 200 prior to the sensor die 200 being coupled to the glass interposer 300. In some embodiments, the conductive coupling structures 210 may be formed on the pads 340 of the glass interposer 300. The sensor die 200 may be coupled to the class interposer 300 through, for example, a solder reflow process. The solder balls 355 may also be attached to the pads 353 though a solder reflow process.

In some embodiments, the solder balls 355 and the sensor die 200 are coupled to the glass interposer 300 at the same time and during a single reflow process. In some embodiments, the solder balls 355 are coupled to the pads 353 in a first reflow process and the sensor die 200 is coupled to the pads 340 in a second reflow process. The sensor die 200 may be susceptible to damage at high temperatures for long periods of time. By breaking the process up into multiple reflow processes, the sensor die may be exposed to high temperatures for shorter periods of time. For example, the first reflow process, in which the solder balls 355 are coupled to the pads 353, may be carried out at a first reflow temperature and a first length of time which may be a relatively high temp for a relatively long duration of time due to the relatively large size of the solder balls 355. The second reflow process may be carried out at a relatively lower temperature or for a relatively shorter time because the conductive coupling structures 210 are smaller, and also because the conductive coupling structures 210 may be made from a different solder alloy that has a lower melting temperature than the solder alloy used in the solder balls 355.

FIG. 4C shows the mounting of electronic components, such as the capacitors 398. The capacitors 398 may be coupled to the surface of the glass interposer 300, for example the top surface of the glass interposer 300, by any suitable material, including solder via a reflow process. The reflow process may be a low temperature reflow process using low temperature solder or solder paste. The reflow process to couple the capacitors 398 to the top surface of the glass interposer may include a relatively low temperature, such as a temperature below which the conductive coupling structures 210 and solder balls 355 do not also reflow, and a relatively short duration. The solder may be a solder alloy that has a lower melting temperature than the solder alloy used in the solder balls 355 or the conductive coupling structures 210.

FIG. 4D shows the application of a coupling material for coupling the lens housing 400 to the glass interposer 300. The coupling material may be any suitable material that holds the lens housing 400 to the glass interposer 300. In some embodiments, the coupling material 305 may be a non-conductive adhesive, glue, or epoxy. The coupling material 305 may be placed on the glass interposer 300 before attaching the lens housing 400 to the glass interposer 300, see FIG. 4E. In some embodiments, the coupling material 305 is applied about the perimeter of the glass interposer 300. In some embodiments, the coupling material 305 is applied about less than the entire perimeter of the glass interposer 300; for example, the coupling material may be applied to two opposite sides of the glass interposer 300, as shown in FIG. 4D.

FIG. 4E shows the attachment of the lens housing 400 to the glass interposer to form the CSP lens module 100. The lens housing 400 may be placed on the top surface of the glass interposer 300 such that the coupling material 305 couples or otherwise attaches the lens housing 400 to the glass interposer 300. In some embodiments, the coupling material 305 may be contact adhesive, such that pressure from the application of the lens housing to the glass interposer 300 causes the coupling material 305 to couple the lens housing 400 to the glass interposer 300. In some embodiments, the coupling material 305 is cured by placing the CSP camera module 100 in an oven at, for example, 90 degrees C., for a time of, for example, one hour, to cure the coupling material 305 and couple the lens housing 400 to the glass interposer 300.

Although not shown, many CSP camera modules 300 or portions of CSP camera modules 300 may be assembled on a glass interposer and then singulated into individual modules as it known in the art.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A camera module comprising:
a glass interposer having a first side and a second side opposite the first side, the glass interposer including a first and a second layer of glass, a conductive trace layer in the second layer of glass and located between the first and second layers of glass, a first conductive through via at the first side and extending through the first layer of glass and a second conductive through via at the second side and extending through the second layer of glass, the conductive trace layer electrically coupling the first conductive through via with the second conductive through via, the glass interposer having a window section extending from the first side to the second side;
an image sensor die mechanically and electrically coupled to the glass interposer at the second side through the second conductive through via; and
a lens adjacent to the first side of the glass interposer, the lens in optical communication with the image sensor die through the window section of the glass interposer.

2. The camera module of claim 1, further comprising an infrared filter on the first side of the glass interposer.

3. The camera module of claim 1, further comprising a conductive pad on the first side of the glass interposer and electrically coupled to the first via.

4. The camera module of claim 3 wherein an electrical component is electrically coupled to the conductive pad.

5. The camera module of claim 1, further comprising:
a coupling material on a perimeter of the first side of the glass interposer; and
a lens housing coupled to the first side of the glass interposer by the coupling material.

6. The camera module of claim 1 wherein the image sensor die includes an image sensor adjacent to the glass interposer.

7. The camera module of claim 1, wherein the conductive trace is a first conductive trace, wherein the glass interposer includes a third glass layer between the first glass layer and the second glass layer and a second conductive trace layer between the first and third layers of glass, the first conductive trace layer being between the second and third layers of glass.

8. The camera module of claim 4, further comprising:
a plurality of conductive traces on the second side of the glass interposer; and
solder balls electrically coupled to the image sensor die through the plurality of conductive traces.

9. The camera module of claim 8, wherein the electrical component is electrically coupled to the conductive pad with a solder alloy and wherein the solder balls have a melting temperature that is higher than a melting temperature of the solder alloy.

10. A method of manufacturing a camera module comprising:
forming a glass interposer having a first side and a second side opposite the first side, the glass interposer having a first layer of glass and a second layer of glass abutting the first layer of glass, a first electrical trace between the first layer of glass and the second layer of glass, the first electrical trace coupled to a first conductive via and a second conductive via, the first conductive via extending through the first layer of glass to the first side of the glass interposer and the second conductive via extending through the second layer of glass to the second side of the glass interposer, the glass interposer having a traceless portion extending from the first side to the second side;
attaching a solder ball to the second side of the glass interposer and electrically coupling the solder ball to a second electrical trace on the second side of the glass interposer;
electrically coupling an image sensor die to the second electrical trace at the second side of the glass interposer and to the second via; and
coupling a lens housing to the first side of the glass interposer, the lens housing in optical communication with the image sensor die through the traceless portion of the glass interposer.

11. The method of manufacturing a camera module of claim 10, wherein electrically coupling the solder ball to the first electrical trace on the second side of the glass interposer includes coupling the solder ball to the electrical trace with solder and reflowing the solder in an oven at a first temperature.

12. The method of manufacturing a camera module of claim 11, wherein electrically coupling the image sensor die to the electrical trace on the second side of the glass interposer and to the second via with solder includes reflowing the solder in an oven at a second temperature, the first temperature being higher than the second temperature.

13. The method of manufacturing a camera module of claim 10, further comprising:
attaching an electrical component to the first side of the glass interposer; and
electrically coupling the electrical component to the first conductive via.

14. The method of manufacturing a camera module of claim 13, wherein the electrical component is electrically coupled to the first conductive via with solder paste.

15. The method of manufacturing a camera module of claim 10, wherein the lens housing is coupled to the glass interposer with an adhesive.

16. The method of manufacturing a camera module of claim 10, wherein the glass interposer includes a third layer of glass between the first layer of glass and the second layer of glass, the first electrical trace between the first layer of glass and the third layer of glass, a third electrical trace between the second layer of glass and the third layer of glass, a third via extending through the first layer of glass, a fourth via extending through the second layer of glass, and the third electrical trace electrically coupling the third via with the fourth via.

17. A camera module comprising:
a glass interposer including:
- a first conductive trace within the glass interposer such that the first conductive trace is between a first glass layer and a second glass layer of the glass interposer;
- a first conductive through via extending at least partially through the first glass layer from a first surface of the glass interposer to the first conductive trace;
- a first conductive pad on the first surface of the glass interposer;
- a second conductive pad on a second surface of the glass interposer, the second surface opposite the first surface, the first conductive through via and the first conductive trace electrically coupling the first conductive pad with the second conductive pad;
- a second conductive trace;
- a third conductive pad on the first surface of the glass interposer;
- a fourth conductive pad on the first surface of the glass interposer, the second conductive trace electrically coupling the third conductive pad with the fourth conductive pad; and
- an image sensor die mechanically and electrically coupled to the first conductive pad and the third conductive pad, the glass interposer operable to transmit light from the second surface, through the first surface, and on to the image sensor die.

18. The camera module of claim 17, further comprising:
a second conductive through via extending at least partially through the second glass layer from the second surface of the glass interposer to the first conductive trace, the first and second conductive through vias and the first conductive trace electrically coupling the first conductive pad with the second conductive pad.

19. The camera module of claim 17, wherein the second conductive trace is on the first surface.

20. The camera module of claim 17, further comprising:
a coupling material on a perimeter of the second surface of the glass interposer; and
a lens housing coupled to the second surface of the glass interposer by the coupling material.

21. The camera module of claim 17 wherein the image sensor die includes an image sensor adjacent to the first surface of the glass interposer.

* * * * *